United States Patent
Schrauwen

(10) Patent No.: US 9,688,835 B2
(45) Date of Patent: *Jun. 27, 2017

(54) THERMOPLASTIC COMPOSITION

(71) Applicant: MITSUBISHI CHEMICAL EUROPE GMBH, Düsseldorf (DE)

(72) Inventor: Bernardus Antonius Gerardus Schrauwen, Leende (NL)

(73) Assignee: MITSUBISHI CHEMICAL EUROPE GMBH, Düsseldorf (DE)

( * ) Notice: Subject to any disclaimer, the term of this patent is extended or adjusted under 35 U.S.C. 154(b) by 162 days.

This patent is subject to a terminal disclaimer.

(21) Appl. No.: 14/385,281

(22) PCT Filed: Mar. 15, 2013

(86) PCT No.: PCT/EP2013/055401
§ 371 (c)(1),
(2) Date: Sep. 15, 2014

(87) PCT Pub. No.: WO2013/076314
PCT Pub. Date: May 30, 2013

(65) Prior Publication Data
US 2015/0035720 A1 Feb. 5, 2015

(30) Foreign Application Priority Data
Mar. 16, 2012 (EP) .................... 12159858

(51) Int. Cl.
C08K 3/22 (2006.01)
H01Q 1/36 (2006.01)
H05K 1/03 (2006.01)
H05K 3/00 (2006.01)
H05K 3/18 (2006.01)
H05K 3/10 (2006.01)

(52) U.S. Cl.
CPC ............... C08K 3/22 (2013.01); H01Q 1/36 (2013.01); H05K 1/0373 (2013.01); H05K 3/0014 (2013.01); H05K 3/105 (2013.01); H05K 3/181 (2013.01); C08K 3/2279 (2013.01); C08K 2003/2231 (2013.01); H05K 2201/0129 (2013.01); H05K 2201/0215 (2013.01); H05K 2201/09118 (2013.01)

(58) Field of Classification Search
CPC C08K 3/22; C08K 3/2279; C08K 2003/2231; H05K 3/0014; H05K 3/181; H05K 1/36; H05K 1/0373; H05K 2201/0215; H05K 2201/0129; H05K 3/10; H05K 3/18; H01Q 1/36
See application file for complete search history.

(56) References Cited

U.S. PATENT DOCUMENTS

| | | | | |
|---|---|---|---|---|
| 5,962,122 A | * | 10/1999 | Walpita | C08K 3/22 428/325 |
| 7,060,421 B2 | | 6/2006 | Naundorf et al. | |
| 2005/0137305 A1 | * | 6/2005 | Carroll, Jr. | B41M 5/267 524/409 |
| 2005/0163987 A1 | * | 7/2005 | Kliesch | B29C 55/023 428/220 |
| 2008/0107880 A1 | | 5/2008 | Kliesch et al. | |
| 2009/0292048 A1 | | 11/2009 | Li et al. | |
| 2011/0034609 A1 | * | 2/2011 | Duijnhoven Van | B01J 13/04 524/430 |
| 2012/0276390 A1 | * | 11/2012 | Ji | H05K 3/185 428/412 |
| 2015/0035720 A1 | * | 2/2015 | Schrauwen | C08K 3/22 343/904 |

FOREIGN PATENT DOCUMENTS

| | | |
|---|---|---|
| CN | 101784607 A | 7/2010 |
| CN | 101903182 A | 12/2010 |
| EP | 1 920 918 A1 | 5/2008 |
| WO | 2009003976 A1 | 1/2009 |
| WO | 2009 024496 A2 | 2/2009 |

OTHER PUBLICATIONS

Charvat, Coloring of Plastics, John Wiley & Sons, p. 259, Mar. 11, 2005.*
Translation of Chinese Office Action dated Jul. 23, 2015 for Application No. 201380014636.5, 5 pages.

* cited by examiner

*Primary Examiner* — Christopher M Rodd
(74) *Attorney, Agent, or Firm* — Hudak, Shunk & Farine Co. LPA

(57) ABSTRACT

A thermoplastic composition including a) a thermoplastic resin and b) a laser direct structuring (LDS) additive in an amount of at least 1 wt. % with respect to the weight of the total composition, wherein the LDS additive includes a mixed metal oxide including at least tin and a second metal selected from the group consisting of antimony, bismuth, aluminum and molybdenum, wherein the LDS additive includes at least 40 wt. % of tin and wherein the weight ratio of the second metal to tin is at least 0.02:1.

19 Claims, No Drawings

THERMOPLASTIC COMPOSITION

FIELD OF THE INVENTION

The present invention relates to a thermoplastic composition comprising a thermoplastic resin and a laser direct structuring additive. The invention also relates to a process for producing a circuit carrier by a laser direct structuring process. The invention also relates to a circuit carrier obtainable thereby.

BACKGROUND OF THE INVENTION

Polymer compositions comprising a polymer and a laser direct structuring (LDS) additive are for example described in U.S. Pat. No. 7,060,421 and WO-A-2009024496. Such polymer compositions can advantageously be used in an LDS process for producing a non-conductive part on which conductive tracks are to be formed by irradiating areas of said part with laser radiation to activate the plastic surface at locations where the conductive path is to be situated and subsequently metalizing the irradiated areas to accumulate metal on these areas. WO-A-2009024496 describes aromatic polycarbonate compositions containing a metal compound capable of being activated by electromagnetic radiation and thereby forming elemental metal nuclei and 2.5-50 wt. % of a rubber like polymer, the latter being added to reduce degradation of the polycarbonate due to the presence of such metal compound in aromatic polycarbonate compositions.

Although the LDS additives known in the prior art are satisfactory in certain situations, there is a constant need for an improved LDS additive.

SUMMARY OF THE INVENTION

It is an object of the present invention to provide a thermoplastic composition which shows an improved performance with respect to plating and mechanical properties.

This object is achieved in that the thermoplastic composition comprises:
a) a thermoplastic resin and
b) a laser direct structuring additive in an amount of at least 1 wt. % with respect to the weight of the total composition, wherein the LDS additive comprises a mixed metal oxide comprising at least tin and a second metal selected from the group consisting of antimony, bismuth, aluminium and molybdenum, wherein the LDS additive comprises at least 40 wt. % of tin and wherein the weight ratio of the second metal to tin is at least 0.02:1.

DETAILED DESCRIPTION OF THE INVENTION

The amounts of each of the metals present in the laser direct structuring additive may be determined by X-ray fluorescence analysis. XRF analysis may e.g. be done using AXIOS WDXRF spectrometer from PANalytical, in conjunction with the software Omnian. In a laser direct structuring process, a thermoplastic composition comprising a thermoplastic resin and a laser direct structuring additive is provided and the thermoplastic composition is irradiated at areas on which conductive tracks are to be formed with laser radiation. The areas irradiated with laser radiation are not yet conductive after the irradiation, but are 'activated' for subsequent metallization. Without wanting to be bound by any theory, it is believed that the laser direct structuring additive is capable of being activated by laser radiation and form elemental metal particles, and these metal particles act as nuclei for metalization. Subsequently the irradiated areas are selectively metalized to form conductive tracks. No metallization occurs on the areas that are not irradiated with laser radiation. The metallization can be done e.g. by a standard electroless plating process, such as a copper plating process.

Surprisingly, it was found according to the present invention that a certain amount of tin is necessary for the plating, but tin does not give enough plating without a certain amount of the second metal. In the process according to the present invention, it is believed that tin predominantly forms elemental metal particles and these metal particles act as nuclei for copper deposition in a standard electroless copper plating process and form the basis for the formation of Cu circuits on the resin. It is believed that tin does not absorb the radiation to a high degree, but the radiation is absorbed predominantly by the second metal and then is transferred to tin. Antimony, bismuth, aluminium and molybdenum are believed to have the function of successfully absorbing the radiation and transferring it to tin. Antimony is preferred as the second metal.

The LDS additive used according to the present invention comprises tin for its possibility to give light color as well as its low cost. It is however believed that copper, nickel, palladium, iridium, platinum, gold and silver may also form elemental metal particles which act as nuclei in the subsequent plating process. Therefore, if tin in the present invention is replaced with one or more of these metals, LDS process is believed to be still possible, although not having the advantages of tin. The mechanism of the activation may also be different.

The laser radiation may be UV light (wavelength from 100 to 400 nm), visible light (wavelength from 400 to 800 nm), or infrared light (wavelength from 800 to 25 000 nm). Other preferred forms of radiation are X-rays, gamma rays, and particle beams (electron beams, [alpha]-particle beams, and [beta]-particle beams). The laser radiation is preferably infrared light radiation, more preferably with a wavelength of 1064 nm.

It has further been found that with the composition according to the invention the toughness as for example expressed in Izod Notched impact strength or the falling dart impact (FDI) energy can be remarkably increased, especially at a low temperature. It has surprisingly been found that the Izod Notched impact strength at −20° C. (measured at a sample thickness of 3.2 mm or less according to ISO 180/4A) of a molded part of the thermoplastic composition can be increased to a value higher than 25 kJ/m$^2$, even higher than 30 kJ/m$^2$, even higher than 35 kJ/m$^2$, even higher than 40 kJ/m$^2$. It has surprisingly been found that the FDI test with a rib (measured at −20° C. according to ISO6603-2 with a modification described elsewhere in the description) on a molded part of the thermoplastic composition can be increased to a value higher than 7 J, even higher than 10 J.

The LDS additive preferably comprises at least 50 wt. % of tin, more preferably 60 wt. % of tin, more preferably 70 wt. % of tin, more preferably 75 wt. % of tin.

The LDS additive having a smaller size was found to give a good mechanical strength to the composition according to the present invention.

Preferably, the LDS additive has a particle size D90 of at most 10 μm, more preferably at most 8 μm. Even more preferably, the LDS additive has a particle size D90 of at most 6 μm, more preferably at most 4 μm, more preferably at most 2.5 μm.

Preferably, the LDS additive has a particle size D50 of at most 6 μm, more preferably at most 5 μm. Even more preferably, the LDS additive has a particle size D50 of at most 3 μm, more preferably at most 1 μm.

The particle size may e.g. be determined by light scattering technology using a Microtrac full range analyzer (FRA) or a Malvern Mastersize particle size analyzer. This may be done according to e.g. ISO13320-1:1999.

Preferably, the weight ratio of the second metal to tin is at most 0.2:1, more preferably at most 0.1:1, more preferably at most 0.05:1. It was found that limiting the amount of the second metal allows limiting the dissipation factor of the composition. This has an advantage that the thermoplastic composition is suitable for use in antennas.

Particularly preferred is when the weight ratio of the second metal to tin is at least 0.03:1 and at most 0.05:1. This ratio results in a very high plating performance, good mechanical properties and a low dissipation factor.

Preferably, the thermoplastic composition according to the present invention has an electrical dissipation factor of at most 0.009 at 2 GHz. The dissipation factor may be measured according to ASTM D-2520, Method B—Resonant Cavity Perturbation Technique. This has an advantage that the composition is especially suitable for antenna applications.

Preferably, major portion of the metals in the mixed metal oxide is tin and the second metal as described above. Preferably, the mixed metal oxide comprises at least 60 wt. % of the total weight of tin and the second metal with respect to the total weight of the metals present in the mixed metal oxide. More preferably, at least 80 wt. %, 90 wt. %, 95 wt. % of 99 wt. % of the total weight of the metals present in the mixed metal oxide is tin and the second metal.

Preferably, the mixed metal oxide is tin antimony oxide, tin bismuth oxide, tin aluminium oxide or tin molybdenum oxide. Tin antimony oxide is particularly preferred.

The LDS additive may be in the form of particles of the mixed metal oxide. The LDS additive may also be in the form of particles of a filler carrier on which the mixed metal oxide is coated.

In the cases where the LDS additive is in the form of particles of a filler carrier on which the mixed metal oxide is coated, the ratio of the filler carrier to the mixed metal oxide has to be chosen so that the amount of tin in the LDS additive is at least 40 wt. %. The filler carrier is preferably chosen so that it does not contribute to a major increase of the dissipation factor. For example, the filler carrier may be a mineral filler such as mica or talc or another metal oxide such as $TiO_2$. $TiO_2$ is more preferred since it was found that $TiO_2$ does not contribute to a major increase of the dissipation factor. Furthermore, the size of the filler carrier is preferably chosen so that the LDS additive particles have a smaller particle size, e.g. D90 of at most 10 μm.

Similarly, the LDS additive may also be in the form of particles in which a further material such as mica, talc or $TiO_2$ is coated on the mixed metal oxide or is attached to the mixed metal oxide in any other form. Also in this case, the ratio of said further material to the mixed metal oxide has to be chosen so that the amount of tin in the LDS additive is at least 40 wt %. The further material is preferably chosen so that the LDS additive particles have a smaller particle size, e.g. D90 of at most 10 μm.

Preferably, major portion of the LDS additive particles is the mixed metal oxide, for providing enough plating performance. Preferably, the LDS additive comprises at least 50 wt % of the mixed metal oxide with respect to the total weight of the LDS additive. More preferably, at least 60 wt. %, at least 80 wt. %, at least 90 wt. % or at least 95 wt. % of the LDS additive is the mixed metal oxide.

Preferably, the LDS additive is the mixed metal oxide.

In a particularly preferred embodiment, the LDS additive is tin antimony oxide particles which are not coated on a filler carrier.

Preferably, the LDS additive of the present invention has a CIELAb colour value L* of at least 45.

As used herein, the L* value of a color is a measure for the lightness of a color according to the Commission Internationale de l'Eclairage L*a*b* color space (CIE 1976; hereinafter "CIELab"). The L*a*b* colorimetric system was standardized in 1976 by Commission Internationale de l'Eclairage (CIE). The CIELab L* value, utilized herein to define the darkness/lightness of the polymer composition according to the present invention, is a unit of color measurement in the afore-mentioned CIELab system. A color may be matched according to CIELab. In the L*a*b* colorimetric system, L* refers to lightness expressed by a numerical value of from 0 to 100, in which L*=0 means that the color is complete black, and L*=100 means that the color is complete white.

The laser direct structuring additive having a CIELAb color value L* of at least 45 allows the thermoplastic composition to have a light color while giving a high plating performance. The possibility to obtain a thermoplastic composition having a light color allows tuning of the color of the thermoplastic composition by addition of corresponding colorants.

Preferably, the thermoplastic composition according to the present invention without colorants has a color value L* of at least 45, more preferably 60, more preferably 75. The higher color value L* obtainable without colorants allows an easy tuning of the color of the thermoplastic composition with a smaller amount of colorants. This is advantageous for the mechanical properties of the thermoplastic composition. Preferably, the laser direct structuring additive has a CIELAB color value L* of at least 50, more preferably at least 60, more preferably at least 75. The higher color value L* of the laser direct structuring additive was found to result in a higher color value L* of the thermoplastic composition.

Preferably, the laser direct structuring additive has a CIELAB color value a* of between −10 and +10 and value b* of between −10 and +10. More preferably, the laser direct structuring additive has a CIELAB color value a* of between −6 and +6 and value b* of between −6 and +6. The low absolute values of a* and b* in combination with high L* value allows obtaining a thermoplastic composition of white color.

The concentration of the component b) present in the composition of the present invention is at least 1 wt. %, preferably between 2 wt. % and 25 wt. %, more preferably between 3 and 20 wt. %, even more preferably between 4 wt. % and 15 wt. %, and particularly preferably from 5 wt. % up to 10 wt. %, with respect to the weight of the total composition.

The concentration of a) thermoplastic resin in the composition of the present invention is preferably between 45 wt. % and 99 wt. %, more preferably between 70 wt. % and 97 wt. %, with respect to the weight of the total composition.

The thermoplastic composition according to the present invention may further comprise c) a colorant. The final color of the thermoplastic composition can thereby be tuned.

Colorants are usually classified into the following three categories: inorganic pigments, organic pigments and dyes (or solvent dyes). The characterizing difference between pigments and dyes is the difference in solubility. Pigments are virtually insoluble in the medium in which they are used, also under processing conditions. They consist of solid crystalline particles that must be dispersed in the polymer in a physical/mechanical way. The color of a pigment is not only dependent on molecular structure, but also on crystal structure and morphology. The color of a polymer/pigment composition is therefore dependent on the quality of the dispersion. Dyes on the other hand are compounds that are soluble under the processing conditions and/or conditions of use. They commonly show an intrinsic affinity with a polymer substrate, and can for example adsorb to a substrate from a solution. Dyes can mix with polymers on a molecular scale, and as a result they can give clear and transparent colors, with high color intensity. In certain cases dyes are therefore preferred to pigments. In other cases pigments are preferred to dyes. When present, the amount of the colorants may be at least 0.1 wt. % with respect to the weight of the total composition. Preferably, the amount of the pigments is at most 20 wt. %, more preferably at most 10 wt. %.

Particularly preferred is a white pigment. A white thermoplastic composition can be thereby obtained. Furthermore, the white pigment increases the L* value of the thermoplastic composition, making it easier to give the thermoplastic composition a desired color by using pigments of choice in combination with it. Examples of the white pigments include $TiO_2$, $BaSO_4$ or ZnO.

Surprisingly, $TiO_2$ was found not only to increase the color value L*, but it also resulted in a surprisingly high plating performance. Furthermore, this combination of the LDS additive and the white pigment surprisingly allows plating even at a low laser energy broadening the laser operation window. Variations in frequency, power, marking speed and/or focal distance do not result in a strong decrease in contrast compared to the optimum contrast obtained using optimum laser settings. Accordingly, a particularly preferred embodiment of the present invention relates to a thermoplastic composition comprising: a) a thermoplastic resin, b) a laser direct structuring additive in an amount of at least 1 wt. % with respect to the weight of the total composition, wherein the LDS additive comprises a mixed metal oxide comprising at least tin and a second metal selected from the group consisting of antimony, bismuth, aluminum and molybdenum, wherein the LDS additive comprises at least 40 wt. % of tin and wherein the weight ratio of the second metal to tin is at least 0.02:1, and c) $TiO_2$. The amount of $TiO_2$ is preferably at least 1 wt. %, more preferably at least 5 wt. %, with respect to the weight of the total composition. Preferably, the amount of the pigments is at most 20 wt %, more preferably at most 10 wt %. with respect to the weight of the total composition.

Other pigments for giving the thermoplastic composition desired colors are known to the skilled person and are commercially available. Known pigments include metal oxides available from companies such as Ferro, BASF, The Shepherd Color Company, Heubach, Rockwood Pigments, Tomatec and Broll-Buntpigmente.

Dyes for giving the thermoplastic composition desired colors are known and are commercially available to the skilled person. Known suitable dyes include Macrolex series from Lanxess such as Macrolex Red 5B and Sicotan series from BASF such as Sicotan Yellow K1010.

The addition of $TiO_2$ allows use of a less amount of the LDS additive for obtaining a good plating performance. This is advantageous for meeting strict environmental requirements. For example, some regulations require the amount of antimony in the thermoplastic composition to be less than 700 ppm. Accordingly, in some embodiments, the amount of antimony in the thermoplastic composition is less than 700 ppm. In some embodiments, the amount of antimony in the thermoplastic composition is less than 700 ppm and the thermoplastic composition comprises at least 10 wt. % of $TiO_2$. Such compositions are advantageous in that it has a low impact on the environment and has a high L* value. Preferably, such compositions have a L* value of at least 80, at least 85, at least 88, at least 90 or even at least 95. Preferably, the amount of antimony is the thermoplastic composition at least 300 ppm. This has a further advantage that the plating performance is extremely high.

It is noted that the amount of $TiO_2$ in the thermoplastic composition is calculated as the sum of any $TiO_2$ added as a separate component from the LDS additive and any $TiO_2$ contained in the LDS additive. For example, in the cases where the LDS additive contains $TiO_2$ (such as where the LDS additive is in the form of particles of $TiO_2$ on which the mixed metal oxide is coated), the amount of $TiO_2$ in the thermoplastic composition is the total of $TiO_2$ in the LDS additive and any $TiO_2$ added as a separate component.

The thermoplastic composition according to the present invention may further comprise d) a mineral filler selected from the group consisting of mica, talk and wollastonite, preferably in an amount of at least 1 wt. % with respect to the weight of the total composition. The mineral filler was found to improve the plating performance. Preferably, the amount of the mineral filler is at most 10 wt. %.

Examples of thermoplastic resins that may be present in the composition according to the invention include, but are not limited to polycarbonate, in particular aromatic polycarbonate, polyamide, polyester, polyesteramide, polystyrene, polymethyl methacrylate or a combination of such resins. The resins may be homopolymers, copolymers or mixtures thereof, and may be branched or non-branched.

Examples of suitable polyamides (PA) are aliphatic polyamides, that may eventually be branched polyamides, such as PA6, PA46, PA66, PA6/66, PA 11, PA12, semi aromatic polyamides as MXD6, PA6I/6T, PA66/6T, PA4T fully aromatic polyamides and copolymers and blends of the listed polyamides. Examples of suitable polyesters are polyethylene terephtalate (PET), polybutylene terephtalate (PBT), polypropylene terephtalate (PPT), polyethylene naphtanoate (PEN), polybutylene naphtanoate (PBN). Preferred polyesters are polyethylene terephtalate and polybutylene terephtalate.

In preferred embodiments, the thermoplastic resin comprises a polycarbonate-based resin. The polycarbonate-based resin may be selected from a polycarbonate or a resin blend that includes a polycarbonate. The polycarbonates may be homopolymers, copolymers and mixtures thereof, and may be branched or non-branched. Suitable polycarbonate-based resins are described e.g. in US 2009/0292048, which is incorporated herein by reference.

Polycarbonates including aromatic carbonate chain units include compositions having structural units of the formula (I):

in which the $R^1$ groups are aromatic, aliphatic or alicyclic radicals. Beneficially, $R^1$ is an aromatic organic radical and, in an alternative embodiment, a radical of the formula (II):

wherein each of $A^1$ and $A^2$ is a monocyclic divalent aryl radical and $Y^1$ is a bridging radical having zero, one, or two atoms which separate $A^1$ from $A^2$. In an exemplary embodiment, one atom separates $A^1$ from $A^2$. Illustrative examples of radicals of this type are —O—, —S—, —S(O)—, —S(O$_2$)—, —C(O)—, methylene, cyclohexyl-methylene, 2-[2,2,1]-bicycloheptylidene, ethylidene, isopropylidene, neopentylidene, cyclohexylidene, cyclopentadecylidene, cyclododecylidene, adamantylidene, or the like. In another embodiment, zero atoms separate A$^1$ from A$^2$, with an illustrative example being bisphenol. The bridging radical Y$^1$ can be a hydrocarbon group or a saturated hydrocarbon group such as methylene, cyclohexylidene or isopropylidene.

Suitable aromatic polycarbonates include polycarbonates made from at least a divalent phenol and a carbonate precursor, for example by means of the commonly known interfacial polymerization process or the melt polymerization method. Suitable divalent phenols that may be applied are compounds having one or more aromatic rings that contain two hydroxy groups, each of which is directly linked to a carbon atom forming part of an aromatic ring. Examples of such compounds are:

4,4'-dihydroxybiphenyl, 2,2-bis(4-hydroxyphenyl)propane (bisphenol A),
2,2-bis(4-hydroxy-3-methylphenyl)propane,
2,2-bis-(3-chloro-4-hydroxyphenyl)-propane,
2,2-bis-(3,5-dimethyl-4-hydroxyphenyl)-propane,
2,4-bis-(4-hydroxyphenyl)-2-methylbutane,
2,4-bis-(3,5-dimethyl-4-hydroxyphenyl)-2-methylbutane,
4,4-bis(4-hydroxyphenyl)heptane, bis-(3,5-dimethyl-4-hydroxyphenyl)-methane,
1,1-bis-(4-hydroxyphenyl)-cyclohexane,
1,1-bis-(3,5-dimethyl-4-hydroxyphenyl)-cyclohexane,
2,2-(3,5,3',5'-tetrachloro-4,4'-dihydroxydiphenyl)propane,
2,2-(3,5,3',5'-tetrabromo-4,4'-dihydroxydiphenyl)propane,
(3,3'-dichloro-4,4'-dihydroxyphenyl)methane,
bis-(3,5-dimethyl-4-hydroxyphenyl)-sulphon, bis-4-hydroxyphenylsulphon,
bis-4-hydroxyphenylsulphide.

The carbonate precursor may be a carbonyl halogenide, a halogen formate or carbonate ester. Examples of carbonyl halogenides are carbonyl chloride and carbonyl bromide. Examples of suitable halogen formates are bis-halogen formates of divalent phenols such as hydroquinone or of glycols such as ethylene glycol. Examples of suitable carbonate esters are diphenyl carbonate, di(chlorophenyl)carbonate, di(bromophenyl)carbonate, di(alkylphenyl)carbonate, phenyltolylcarbonate and the like and mixtures thereof. Although other carbonate precursors may also be used, it is preferred to use the carbonyl halogenides and in particular carbonylchloride, also known as phosgene.

The aromatic polycarbonates in the composition according to the invention may be prepared using a catalyst, an acid acceptor and a compound for controlling the molecular mass.

Examples of catalysts are tertiary amines such as triethylamine, tripropylamine and N,N-dimethylaniline, quaternary ammonium compounds such as tetraethylammoniumbromide and quaternary phosphonium compounds such as methyltriphenylfosfoniumbromide.

Examples of organic acid acceptors are pyridine, triethylamine, dimethylaniline and so forth. Examples of inorganic acid acceptors are hydroxides, carbonates, bicarbonates and phosphates of an alkali metal or earth alkali metal.

Examples of compounds for controlling the molecular mass are monovalent phenols such as phenol, p-alkylphenols and para-bromophenol and secondary amines.

The thermoplastic resin may be a blend of, on one hand, resins such as polycarbonate, polyamide, polyester, polyesteramide, polystyrene, polymethyl methacrylate, and on the other hand, at least one rubber like polymer. Examples of rubber-like polymer are described in WO-A-2009024496, which is incorporated herein by reference. Particularly preferred is a blend of polycarbonate and the rubber-like polymer. The rubber-like polymer is or contains an elastomeric (i.e. rubbery) polymer having preferably a Tg less than about 10° C., more specifically less than about −10° C., or more specifically about −20° C. to −80° C.

Examples of elastomeric polymers include polyisoprene; butadiene based rubbers like polybutadiene, styrene-butadiene random copolymer and block copolymer, hydrogenates of said block copolymers, acrylonitrile-butadiene copolymer and butadiene-isoprene copolymer; acrylate based rubbers like ethylene-methacrylate and ethylene-butylacrylate, acrylate ester-butadiene copolymers, for example acrylic elastomeric polymers such as butylacrylate-butadiene copolymer; siloxane based rubbers like polyorganosiloxanes such as for example polydimethylsiloxane, polymethylphenylsiloxane and dimethyl-diphenylsiloxane copolymer; and other elastomeric polymers like ethylene-propylene random copolymer and block copolymer, copolymers of ethylene and [alpha]-olefins, copolymers of ethylene and aliphatic vinyl such as ethylene-vinyl acetate, and ethylene-propylene non-conjugated diene terpolymers such as ethylene-propylene-hexadiene copolymer, butylene-isoprene copolymer, and chlorinated polyethylene, and these substances may be used individually or in combinations of two or more.

Particularly preferred elastomeric polymers include ABS resin (acrylonitrile-butadiene-styrene copolymer), AES resin (acrylonitrile-ethylene-propylene-styrene copolymer), AAS resin (acrylonitrile-acrylic elastomer-styrene copolymer), and MBS (methyl methacrylate butadiene styrene copolymer). Particularly preferred graft copolymers are acrylonitrile butadiene styrene rubber (ABS), methylmethacrylate butadiene styrene rubber (MBS) or a mixture of these copolymers, because of the high compatibility between the polycarbonate matrix and such copolymers, thereby enabling that these copolymers can be uniformly dispersed into the polycarbonate matrix. This decreases any degradation of the thermoplastic resin that may be caused by certain types of component b). From an economic point of view acrylonitrile butadiene styrene (ABS) is even more preferred. Any commercially available ABS may be applied. Particularly preferred acrylonitrile butadiene styrene (ABS) is acrylonitrile butadiene styrene a rubber content of 10 to 50 parts by weight, preferably 10 to 40 parts by weight and even more preferably 10 to 30 parts by weight.

Preferably, the concentration of the rubber-like polymer in the thermoplastic resin a) is 0-60 wt % of the amount of the thermoplastic resin a).

The thermoplastic composition according to the invention may further comprise from 0 up to 25 wt. % of one or more other additives, relative to the total weight of the composition. These include the customary additives such as stabilizers against thermal or thermo-oxidative degradation, stabilizers against hydrolytic degradation, stabilizers against degradation from light, in particular UV light, and/or photooxidative degradation, anti-drip agents such as for example PTFE, processing aids such as release agents and lubricants, colorants such as pigments and dyes. Suitable examples of such additives and their customary amounts are stated in the aforementioned Kunststoff Handbuch, 3/1.

Preferably, the thermoplastic composition according to the present invention comprises a) 45-99 wt. % of the thermoplastic resin, b) 1-25 wt. % of the laser direct structuring additive, c) 0-20 wt. % of the colorant and d) 0-10 wt. % of the mineral filler. The thermoplastic composition according to the present invention may further comprise 0-25 wt. %, preferably 0.5-5 wt. %, of the other additives. Thus, total amounts of the components a), b), c) and d) is preferably 75-100 wt. %, preferably 95-99.5 wt. %, with respect to the total weight of the composition. Preferably, the concentration of the rubber-like polymer in the thermoplastic resin is 0-50 wt. % of the amount of the thermoplastic resin a).

In preferred embodiments, the thermoplastic composition according to the present invention comprises a) 70-97 wt. % of the thermoplastic resin, b) 1-10 wt. % of the laser direct structuring additive, c) 1-10 wt. % of the colorant and d) 1-10 wt. % of the mineral filler.

In addition to the components described above, reinforcing agents such as glass fibres can be added to the thermoplastic composition according to the present invention. It is to be understood that the reinforcing agents such as glass fibres are not included in the weight of the total composition of the thermoplastic composition according to the present invention for the calculation of the concentration of each of the components. The weight ratio of the reinforcing agents such as glass fibres to the thermoplastic composition according to the present invention may be at most e.g. 1:1 or 1:2, and at least e.g. 1:20 or 1:10. Accordingly, the present invention provides a composition comprising the thermoplastic composition according to the present invention and reinforcing agents such as glass fibres.

It is noted that the present invention also relates to a thermoplastic composition which does not or substantially does not include reinforcing agents such as glass fibres. The present invention also relates to the thermoplastic composition which includes reinforcing agents such as glass fibres at a weight ratio of the reinforcing agents such as glass fibres to the thermoplastic composition according to the present invention of at most 1:20, 1:50 or 1:100.

The components b) and optionally c), d) and other additives as described above may be introduced into the thermoplastic resin a) by means of suitable mixing devices such as single-screw or twin-screw extruders, preferably a twin-screw extruder is used. Preferably, thermoplastic resin pellets are introduced into the extruder together with at least components b) and extruded, then quenched in a water bath and then pelletized. The invention therefore further relates to a process for producing a thermoplastic composition according to the present invention by melt mixing components a), b), and other (particulate) additives and reinforcing agents.

The invention further relates to moulded parts that contain the thermoplastic composition according to the present invention. The invention relates in particular to a moulded part produced by injection moulding of the composition according to the invention. The invention further also relates to an article, in particular a circuit carrier, that contains a moulded part produced from the composition according to the invention. In one embodiment, such a circuit carrier is used for producing an antenna.

The invention further relates to a process for producing such a circuit carrier which process comprises the steps of providing a moulded part that contains the thermoplastic composition according to the present invention, irradiating areas of said part on which conductive tracks are to be formed with laser radiation, and subsequently metallizing the irradiated areas. In a preferred embodiment, the laser irradiation is used to simultaneously release metal nuclei and effect ablation of the part while forming an adhesion-promoting surface. This provides a simple means to achieve excellent adhesive strength of the deposited metallic conductor tracks. The wavelength of the laser is advantageously 248 nm, 308 nm, 355 nm, 532 nm, 1064 nm or of even 10600 nm. The deposition of further metal onto the metal nuclei generated by laser radiation preferably takes place via plating processes. Said metallization is preferably performed by immersing the moulded part in at least one electroless plating bath to form electrically conductive pathways on the irradiated areas of the moulded part. Non-limiting examples of electroless plating processes are a copper plating process, gold plating process, nickel plating process, silver plating, zinc plating and tin plating.

The invention further relates to use of a mixed metal oxide as an LDS additive in an LDS process, wherein the mixed metal oxide comprises at least tin and a second metal selected from the group consisting of antimony, bismuth, aluminium and molybdenum, wherein the LDS additive comprises at least 40 wt. % of tin and wherein the weight ratio of the second metal to tin is at least 0.02:1. The invention will now be elucidated with reference to the following examples and comparative experiments.

A further aspect of the present invention relates to the thermoplastic composition for use in a laser direct structuring process.

EXAMPLES

The compositions of Comparative Experiments CEx 1-11 and of the Examples Ex 1 to Ex 5 were prepared from the components as given in Table 1. Additionally, additives for processing and stabilization were added. Depending on the base resins used (PC-ABS or PC), these additives include Mold Release Agent (Loxiol P861/3.5, supplied by Cognis) and Heat Stabilizer (Irgafos 168, supplied by BASF) for PC based blends and additionally Antioxidant (Irganox 1076, supplied by BASF) and Mono Zinc Phosphate (Z 21-82, supplied by Budenheim) for the PC-ABS based blends.

Table 2 gives the specific properties of the LDS additives that were used. The compositions of the LDS additives were measured by X-ray fluorescence analysis. The LDS additives indicated as ATO1 and ATO2 were particles of mica coated with a mixed metal oxide. The LDS additives indicated as ATO3-ATO7 and MMO1 and MMO2 were particles of a mixed metal oxide. The amounts of each of the metals present in the metal compound were determined by X-ray fluorescence analysis. XRF analysis was done using AXIOS WDXRF spectrometer from PANalytical, in conjunction with the software Omnian. The samples were pressed into measuring discs and the analysis of the measuring discs were performed in vacuum atmosphere.

The particle size distribution values (D50 and D90) are values as obtained by the suppliers. According to supplier information a Malvern Mastersizer particle size analyser 2000 was used to measure the particle size distribution of materials ATO 1 to ATO 7.

The color values (L*, a* and b*) of the LDS additives were measured as a powder using a Minolta 3700d as spectrophotometer with diffuse/8° geometry. A CIE Standard illuminant D65 is used as light source and 10° is used as standard Observer. Color space is CIE Lab 76. Instrument settings are specular included, reflectance measuring on a measuring area of 380-720 nm. Average value of 3 measurements is used as the color value. The L* value in the CIELab model represent the luminance of the color.

Table 3 gives the typical composition of the Mixed Metal Oxides (MMO) as obtained from the supplier, including the typical weight percentage of Sb.

All sample compositions were prepared according the amounts as given in Table 4 to 7. All amounts are in weight percentage. In each of the experiments, samples were extruded on a co-rotating twin screw extruder at a temperature of 280°. The extrudate was granulated and the collected granulate was dried for 4 hours at a temperature of 100° C. and subsequently injection moulded into plaques of 60*60*2 mm, plaques with similar dimension with a rib of 2*2*20 mm on one side and ASTM-sized Izod bars (64*12.7*3.2 mm) using a melt temperature of approximately 260° C.-270° C.

Izod Notched impact strength was measured according to ISO180/4A at a temperature of 23° C. and −20° C. Izod Notched Impact strength is reported as the average value of 5 measurements.

Falling Dart Impact (FDI) energy was measured according to ISO 6603-2 at a temperature of −20° C. However this test was not performed on standard molded plaques of 60*60*2 mm, but on molded plaques of 60*60*2 mm with a rib of 2*2*20 mm in the mid of one side of this plaque. The test was performed with the rib at the opposite side from the dart impact. Falling Dart Impact energy is reported as the average value of 5 measurements.

Plating performance was judged by visual inspection after laser activation of the injection molded plaques using different laser power and frequency and a subsequent plating procedure in an electroless copper bath. Laser activation of the surface was done using a Trumpf VectorMark Compact VMC1 Nd:YAG, 1064 nm Infrared laser, with a maximum power of 15 W at a frequency of 10 kHz and a maximum power of about 10 W at a frequency of 25 KHz. At each frequency the power was varied according to the values given in Table 6. Laser spot size was 30 µm, hatch distance was kept at 50 µm and laser speed at 1000 mm/sec. Plating was done for a time period of 20 minutes in an ENPLATE LDS CU 400 PC plating bath from Enthone operating at a temperature of 48° C.

The color values (L*, a* and b*) of the thermoplastic compositions were measured on an injection moulded plaques having a thickness of 2 mm. The measuring conditions were the same as the measuring conditions of the LDS additives.

The dielectric constant and the electrical dissipation factor were measured at 2 GHz. The testing was conducted using the guidelines of ASTM D-2520, Method B—Resonant Cavity Perturbation Technique. Each test sample consisted of 3 pieces of material. The nominal size (mm) of the test sample was 5.6×5.8×25.

Examples 1-2 and Comparative Experiments 1-5

Table 4 shows the effects of seven different types of LDS additives in a PC-ABS composition.

CEx 1-3 use LDS additives in which the Sn:Sb ratio is low. Their plating performance is poor, which shows that a certain amount of Sb is required for plating.

CEx 4-5 use LDS additives in which the Sn:Sb ratio is high but the Sn content is low and the particle size is high. Their plating performance is reasonably good. However, the mechanical properties are less favourable. Especially, the FDI energy is much lower than the other examples. The dielectric constant and the dissipation factor are also higher.

Ex 1-2 use LDS additives in which the Sn:Sb ratio and the Sn content are within the ranges specified by the present invention. The plating performance is good. Especially, Ex 1 shows a remarkably good plating performance. The mechanical properties are also at a good level. The dielectric constant and the dissipation factor are low, making the composition especially suitable for antenna applications.

Example 3 and Comparative Experiment 6-9

Table 5 shows the effects of different types of LDS additives on the plating performance in a PC-ABS composition.

Table 5 shows CEx6 and CEx7 where the LDS additive does not contain Sn. No plating was observed. CEx 8 does not contain any LDS additive, and again no plating was observed. CEx 9 and Ex 3 contains LDS additives containing Sb and Sn as well as TiO2. Good plating performance is shown.

CEx 9 is expected to show less favourable mechanical properties and RF properties, from Table 4.

Examples 4-5 and Comparative Experiments 10-11

Table 6 shows the effects of different types of LDS additives on the plating performance in a PC composition.

Also for a PC composition, it can be clearly seen that plating requires a minimum ratio of Sb to Sn.

Comparison of Ex 4 in Table 6 and Ex 3 in Table 5 indicates that $TiO_2$ improves plating performance.

Examples 1-2 and 6-9

Table 7 shows the effects of the amounts of the LDS additives and $TiO_2$ on the plating performance in a PC-ABS composition.

Comparison of Ex 1 and Ex 6 shows that the plating performance improves with the amount of the LDS additive. Comparison of Ex 6 and Ex 7 shows that the addition of $TiO_2$ allows a good plating performance while maintaining the composition to have a low impact on the environment. Comparison of Ex 2, Ex 8 and Ex 9 shows the same trend.

TABLE 1

| Material | Type | Supplier |
|---|---|---|
| Polycarbonate (PC) | LVN (ISO 1628/4) = 47.5-52.5 ml/g | MEP |
| ABS | Santac ST-55 | Mitsui Germany |
| MBS | Kane Ace M511 | Kaneka |
| ATO 1 | Lazerflair 825 (Mica coated with: Antimony Tin Oxide) | Merck KGaA |
| ATO 2 | Lazerflair 820 (Mica coated with: Titanium dioxide + Silicon dioxide + Antimony Tin Oxide) | Merck KGaA |
| ATO 3 | Minatec 230 A-IR (Antimony Tin Oxide) | Merck KGaA |
| ATO 4 | Stanostat CP40W (Antimony Tin Oxide) | Keeling & Walker |
| ATO 5 | Stanostat CP15G (Antimony Tin Oxide) | Keeling & Walker |
| ATO 6 | Stanostat CP5C (Antimony Tin Oxide) | Keeling & Walker |
| ATO 7 | 25-3511 PK (Antimony Tin Oxide) | Ferro |
| MMO 1 | Yellow 10P225 (Chrome Antimony Titanate) | The Shepherd Color Company |
| MMO 2 | Brown 10P835 (Manganese Antimony Titanate) | The Shepherd Color Company |
| White Pigment | Kronos 2233 (Titanium dioxide) | Kronos |

ATO = Antimony Tin Oxide
MMO = Mixed Metal Oxide

TABLE 2

| Material | ATO 1 | ATO 2 | ATO 3 | ATO 4 | ATO 5 | ATO 6 | ATO 7 |
|---|---|---|---|---|---|---|---|
| Sn—Sb Composition (XRF measurement) | | | | | | | |
| Sn [%] | 31 | 28 | 78 | 78 | 78 | 76 | 77 |
| Sb [%] | 4.7 | 4.5 | 0.9 | 0.7 | 1.3 | 2.7 | 1.8 |
| Ratio Sb:Sn | 0.152:1 | 0.161:1 | 0.012:1 | 0.009:1 | 0.017:1 | 0.036:1 | 0.023:1 |
| Typical Particle Size (supplier information) | | | | | | | |
| D50% [μm] | 6.5 | 8.3 | 0.6 | 0.8 | 0.6 | 1.0 | 3.5 |
| D90% [μm] | 11.7 | 15.2 | 1.6 | 2.0 | 1.8 | 1.9 | 6.9 |
| Color Measurement (CIELab 76, Illuminant D65, 10° Observer) | | | | | | | |
| L* | 85.4 | 80.9 | 90.4 | 91.2 | 89.1 | 76.7 | 59.6 |
| a* | −2.0 | −3.2 | −1.7 | −1.4 | −1.5 | −2.6 | −2.2 |
| b* | 1.7 | 2.2 | 3.3 | 3.7 | 4.1 | −3.1 | −5.5 |

TABLE 3

| | Material | | |
|---|---|---|---|
| Supplier information | MMO 1 | MMO 2 | 25 |
| Composition | Cr—Sb—Ti | Mn—Sb—Ti | |
| Typical % Sb | 12 | 18 | |
| Ratio Sb:other metals | 0.136:1 | 0.220:1 | |

TABLE 4

| | | Sample | | | | | | |
|---|---|---|---|---|---|---|---|---|
| Components | Unit | CEx 1 | CEx 2 | CEx 3 | CEx 4 | CEx 5 | Ex 1 | Ex 2 |
| PC | % | 52 | 52 | 52 | 52 | 52 | 52 | 52 |
| ABS | % | 30 | 30 | 30 | 30 | 30 | 30 | 30 |
| MBS | % | 5 | 5 | 5 | 5 | 5 | 5 | 5 |
| ATO 1 (Sb:Sn = 0.152:1) | % | | | | 5 | | | |
| ATO 2 (Sb:Sn = 0.161:1) | % | | | | | 5 | | |
| ATO 3 (Sb:Sn = 0.012:1) | % | 5 | | | | | | |
| ATO 4 (Sb:Sn = 0.009:1) | % | | 5 | | | | | |
| ATO 5 (Sb:Sn = 0.017:1) | % | | | 5 | | | | |
| ATO 6 (Sb:Sn = 0.036:1) | % | | | | | | 5 | |
| ATO 7 (Sb:Sn = 0.023:1) | % | | | | | | | 5 |
| White Pigment | % | 7 | 7 | 7 | 7 | 7 | 7 | 7 |
| Other Additives | % | 1 | 1 | 1 | 1 | 1 | 1 | 1 |
| Total | % | 100 | 100 | 100 | 100 | 100 | 100 | 100 |
| Platina Performance at different laser settings | | | | | | | | |
| 40% power @ 10 kHz | | x | x | x | ○ | ○ | ⊖ | ○ |
| 60% power @ 10 kHz | | x | x | x | ⊖ | ⊖ | ⊖ | ○ |
| 80% power @ 10 kHz | | x | x | x | ⊖ | Δ | ⊖ | Δ |
| 99% power @ 10 kHz | | x | x | x | ○ | Δ | ○ | Δ |
| 40% power @ 25 kHz | | x | x | x | x | ○ | ⊖ | ⊖ |
| 60% power @ 25 kHz | | x | x | x | ⊖ | ⊖ | ⊖ | ○ |
| 80% power @ 25 kHz | | x | x | x | ○ | ○ | ⊖ | ○ | x = no plating (bad)
Δ = plating started (fair)
○ = plating almost full (good)
⊖ = plating full (best)

| | | | | | | | | |
|---|---|---|---|---|---|---|---|---|
| PC | % | 52 | 52 | 52 | 52 | 52 | 52 | 52 |
| ABS | % | 30 | 30 | 30 | 30 | 30 | 30 | 30 |
| MBS | % | 5 | 5 | 5 | 5 | 5 | 5 | 5 |
| ATO 1 (Sb:Sn = 0.152:1) | % | | | | 5 | | | |
| ATO 2 (Sb:Sn = 0.161:1) | % | | | | | 5 | | |
| ATO 3 (Sb:Sn = 0.012:1) | % | 5 | | | | | | |
| ATO 4 (Sb:Sn = 0.009:1) | % | | 5 | | | | | |

TABLE 4-continued

| Components | Unit | CEx 1 | CEx 2 | CEx 3 | CEx 4 | CEx 5 | Ex 1 | Ex 2 |
|---|---|---|---|---|---|---|---|---|
| ATO 5 (Sb:Sn = 0.017:1) | % | | | 5 | | | | |
| ATO 6 (Sb:Sn = 0.036:1) | % | | | | | | 5 | |
| ATO 7 (Sb:Sn = 0.023:1) | % | | | | | | | 5 |
| White Pigment | % | 7 | 7 | 7 | 7 | 7 | 7 | 7 |
| Other Additives | % | 1 | 1 | 1 | 1 | 1 | 1 | 1 |
| Total | % | 100 | 100 | 100 | 100 | 100 | 100 | 100 |
| Mechanical Properties | | | | | | | | |
| Izod Notched (23° C.) | kJ/m$^2$ | 72 | 68 | 68 | 52 | 53 | 72 | 64 |
| Izod Notched (−20° C.) | kJ/m$^2$ | 44 | 46 | 45 | 38 | 39 | 45 | 43 |
| FDI with rib (−20° C.) | J | 14 | 17 | 14 | 3 | 3 | 13 | 12 |
| RF Properties @ 2 GHz | | | | | | | | |
| Dielectric Constant | — | | | | 3.79 | 3.82 | 3.05 | 3.01 |
| Dissipation Factor | — | | | | 0.028 | 0.011 | 0.005 | 0.005 |
| Color Measurement (CIELab 76, Illuminant D65, 10° Observer) | | | | | | | | |
| L* | — | 93.4 | 94.0 | 93.8 | 88.8 | 87.2 | 87.5 | 83.9 |
| a* | — | −0.9 | −1.0 | −1.1 | −2.1 | −2.4 | −2.5 | −2.5 |
| b* | — | 2.3 | 2.2 | 2.5 | 0.5 | −1.0 | −3.1 | −4.7 |

TABLE 5

| Components | Unit | CEx 6 | CEx 7 | CEx 8 | CEx 9 | Ex 3 |
|---|---|---|---|---|---|---|
| PC | % | 56 | 56 | 59 | 56 | 56 |
| ABS | % | 30 | 30 | 30 | 30 | 30 |
| MBS | % | 5 | 5 | 5 | 5 | 5 |
| MMO 1 (Sb:metal = 0.136:1) | % | 8 | | | | |
| MMO 2 (Sb:metal = 0.220:1) | % | | 8 | | | |
| ATO 1 (Sb:Sn = 0.152:1) | % | | | | 3 | |
| ATO 6 (Sb:Sn = 0.036:1) | % | | | | | 3 |
| White Pigment | % | | | 5 | 5 | 5 |
| Other Additives | % | 1 | 1 | 1 | 1 | 1 |
| Total | % | 100 | 100 | 100 | 100 | 100 |
| Plating Performance at different laser settings | | | | | | |
| 40% power @ 10 kHz | | x | x | x | ○ | ⊖ |
| 60% power @ 10 kHz | | x | x | x | Δ | Δ |
| 80% power @ 10 kHz | | x | x | x | Δ | Δ |
| 99% power @ 10 kHz | | x | x | x | x | x |
| 40% power @ 25 kHz | | x | x | x | Δ | ○ |
| 60% power @ 25 kHz | | x | x | x | ○ | ⊖ |
| 80% power @ 25 kHz | | x | x | x | ○ | ○ |
| Color Measurement (CIELab 76, Illuminant D65, 10° Observer) | | | | | | |
| L* | — | 70.4 | 40.6 | 96.3 | 88.2 | 87.4 |
| a* | — | 18.3 | 8.8 | −0.4 | −1.9 | −2.5 |
| b* | — | 52.4 | 9.1 | 2.6 | 0.1 | −3.2 |

TABLE 6

| Components | Unit | CEx 10 | CEx 11 | Ex 4 | Ex 5 |
|---|---|---|---|---|---|
| PC | % | 96.5 | 96.5 | 96.5 | 96.5 |
| ATO 2 (Sb:Sn = 0.161:1) | % | 3 | | | |
| ATO 3 (Sb:Sn = 0.012:1) | % | | 3 | | |
| ATO 6 (Sb:Sn = 0.036:1) | % | | | 3 | |
| ATO 7 (Sb:Sn = 0.023:1) | % | | | | 3 |
| Other Additives | % | 0.5 | 0.5 | 0.5 | 0.5 |
| Total | % | 100 | 100 | 100 | 100 |
| Plating Performance at different laser settings | | | | | |
| 40% power @ 10 kHz | | x | x | Δ | x |
| 60% power @ 10 kHz | | Δ | x | ○ | Δ |
| 80% power @ 10 kHz | | ○ | x | ○ | Δ |
| 99% power @ 10 kHz | | ○ | x | ○ | ○ |
| 40% power @ 25 kHz | | x | x | x | x |
| 60% power @ 25 kHz | | x | x | x | x |
| 80% power @ 25 kHz | | x | x | Δ | x |
| Color Measurement (CIELab 76, Illuminant D65, 10° Observer) | | | | | |
| L* | — | 63.8 | 61.8 | 54.8 | 38.5 |
| a* | — | −2.3 | 0.8 | −3.2 | −2.7 |
| b* | — | 4.0 | 6.0 | −3.1 | −6.8 |

TABLE 7

| Components | Unit | Ex 1 | Ex 6 | Ex 7 | Ex 2 | Ex 8 | Ex 9 |
|---|---|---|---|---|---|---|---|
| PC | % | 52 | 55 | 47 | 52 | 54 | 49 |
| ABS | % | 30 | 30 | 30 | 30 | 30 | 30 |
| MBS | % | 5 | 5 | 5 | 5 | 5 | 5 |
| ATO 6 | % | 5 | 2 | 2 | | | |
| ATO 7 | % | | | | 5 | 3 | 3 |

TABLE 7-continued

| Components | Unit | Ex 1 | Ex 6 | Ex 7 | Ex 2 | Ex 8 | Ex 9 |
|---|---|---|---|---|---|---|---|
| White Pigment | % | 7 | 7 | 15 | 7 | 7 | 12 |
| Other Additives | % | 1 | 1 | 1 | 1 | 1 | 1 |
| Total | % | 100 | 100 | 100 | 100 | 100 | 100 |
| Calculated percentage of elements Sb, Sn and Ti* | | | | | | | |
| Sb | ppm | 1350 | 540 | 540 | 900 | 540 | 540 |
| Sn | % | 3.8 | 1.52 | 1.52 | 3.85 | 2.31 | 2.31 |
| Ti | % | 4.05 | 4.05 | 8.7 | 4.05 | 4.05 | 6.95 |
| Plating Performance at different laser settings | | | | | | | |
| 40% power @ 10 kHz | | ⊖ | x | ○ | ○ | Δ | Δ |
| 60% power @ 10 kHz | | ⊖ | Δ | ⊖ | ○ | Δ | ⊖ |
| 80% power @ 10 kHz | | ⊖ | ○ | ⊖ | Δ | Δ | ○ |
| 40% power @ 25 kHz | | ⊖ | Δ | Δ | ⊖ | ○ | ○ |
| 60% power @ 25 kHz | | ⊖ | Δ | ○ | ○ | Δ | ⊖ |
| 80% power @ 25 kHz | | ⊖ | ○ | ⊖ | ○ | Δ | ⊖ |

*As could be quantified by XRF measurement

What is claimed is:

1. A thermoplastic composition comprising:
   a) 65 wt % to 99 wt % with respect to the weight of the total composition of a thermoplastic resin and
   b) a laser direct structuring (LDS) additive in an amount of at least 1 wt. % with respect to the weight of the total composition, wherein the LDS additive comprises a mixed metal oxide comprising at least tin and a second metal that is antimony, bismuth, aluminum or molybdenum,
   wherein the LDS additive comprises at least 40 wt % of tin and
   wherein the weight ratio of the second metal to tin is at least 0.03:1.

2. The thermoplastic composition according to claim 1, wherein the LDS additive has a particle size D90 of at most 10 μm, as determined by light scattering technology according to ISO13320-1:1999.

3. The thermoplastic composition according to claim 1, wherein the LDS additive has a particle size D90 of at most 2.5 μm, as determined by light scattering technology according to ISO13320-1:1999.

4. The thermoplastic composition according to claim 1, wherein the weight ratio of the second metal to tin is at most 0.2:1.

5. The thermoplastic composition according to claim 1, wherein the weight ratio of the second metal to tin is at most 0.05:1.

6. The thermoplastic composition according to claim 1, wherein the thermoplastic resin has an electrical dissipation factor of at most 0.009 at 2 GHz, as measured according to ASTM D-2520, Method B.

7. The thermoplastic composition according to claim 1, wherein the mixed metal oxide comprises at least 60 wt % of the total weight of tin and the second metal with respect to the total weight of the metals present in the mixed metal oxide.

8. The thermoplastic composition according to claim 1, wherein the mixed metal oxide is antimony tin oxide.

9. The thermoplastic composition according to claim 1, wherein the LDS additive comprises at least 50 wt. % of the mixed metal oxide with respect to the total weight of the LDS additive.

10. The thermoplastic composition according to claim 1, wherein the thermoplastic resin is a polycarbonate-based resin.

11. The thermoplastic composition according to claim 1, wherein the thermoplastic composition comprises the thermoplastic resin in an amount of between 70 wt % and 97 wt. % with respect to the weight of the total composition.

12. The thermoplastic composition according to claim 1, wherein the thermoplastic composition comprises the laser direct structuring additive in an amount of between 2 wt. % and 25 wt. %, with respect to the weight of the total composition.

13. The thermoplastic composition according to claim 1, wherein the thermoplastic composition comprises the laser direct structuring additive in an amount of between 5 wt. % up to 10 wt. % with respect to the weight of the total composition.

14. The thermoplastic composition according to claim 1, wherein the amount of antimony in the thermoplastic composition is less than 700 ppm and the thermoplastic composition comprises at least 10 wt. % of $TiO_2$.

15. A moulded part that contains the thermoplastic composition according to claim 1.

16. A process for producing a circuit carrier, comprising the steps of: providing the moulded part according to claim 15; irradiating areas of said part on which conductive tracks are to be formed with laser radiation; and subsequently metalizing the irradiated areas.

17. A circuit carrier obtained by a process for producing the circuit carrier, comprising providing the moulded part according to claim 15; irradiating areas of said part on which conductive tracks are to be formed with laser radiation; and subsequently metalizing the irradiated areas.

18. An antenna comprising the circuit carrier according to claim 17.

19. A laser direct structuring (LDS) method, comprising the step of: providing a mixed metal oxide as an LDS additive in a thermoplastic composition, wherein the mixed metal oxide comprises at least tin and a second metal that is antimony, bismuth, aluminium or molybdenum, wherein the LDS additive comprises at least 40 wt % of tin and wherein the weight ratio of the second metal to tin is at least 0.03:1.

* * * * *